United States Patent [19]
Hsu

[11] Patent Number: 6,022,794
[45] Date of Patent: Feb. 8, 2000

[54] METHOD OF MANUFACTURING A BURIED CONTACT IN A STATIC RANDOM ACCESS MEMORY

[75] Inventor: Chen-Chung Hsu, Taichung, Taiwan

[73] Assignee: United Microeletronics Corp., Taipei, Taiwan

[21] Appl. No.: 09/123,341

[22] Filed: Jul. 28, 1998

[30] Foreign Application Priority Data

May 25, 1998 [TW] Taiwan ................................ 87108043

[51] Int. Cl.[7] ................................................. H07L 21/425
[52] U.S. Cl. .......................... 438/526; 438/581; 438/592
[58] Field of Search ..................................... 438/581, 583, 438/592, 629, 630, 649, 651, 655, 682, 526

[56] References Cited

U.S. PATENT DOCUMENTS

| | | | |
|---|---|---|---|
| 4,378,628 | 4/1983 | Levinstein et al. ...................... | 438/592 |
| 5,177,030 | 1/1993 | Lee et al. ................................ | 438/385 |
| 5,204,279 | 4/1993 | Chan et al. ............................. | 438/153 |
| 5,585,299 | 12/1996 | Hsu ........................................ | 438/275 |
| 5,700,711 | 12/1997 | Hsu et al. ............................... | 438/238 |

*Primary Examiner*—John F. Niebling
*Assistant Examiner*—Christopher Lattin
*Attorney, Agent, or Firm*—Thomas, Kayden, Horstemeyer & Risley

[57] ABSTRACT

A method of manufacturing the buried contact window of an SRAM cell. The method includes the steps of first providing a first conductive type substrate that has an isolating structure and a gate thereon. The gate comprises a gate oxide layer, a polysilicon layer and a sacrificial layer. Next, a heavily doped region of a second conductive type is formed in the substrate between the device isolating structure and the gate terminal. The heavily doped region acts as a buried contact window. Thereafter, a metal silicide layer is formed over the heavily doped region so that the two are electrically coupled. Next, the sacrificial layer is removed, and then a conductive layer that includes a polysilicon layer and a tungsten silicide layer is formed over the substrate. Subsequently, the conductive layer is patterned to form a conductive line layer and a gate stack. Finally, a source/drain region having a lightly doped drain structure is formed in the substrate between the conductive line layer and the gate stack layer, wherein the conductive line layer and the metal silicide layer are electrically coupled.

38 Claims, 7 Drawing Sheets

METHOD OF MANUFACTURING A BURIED CONTACT IN A STATIC RANDOM ACCESS MEMORY

CROSS-REFERENCE TO RELATED APPLICATION

This application claims the priority benefit of Taiwan application serial no. 87108043, filed May 25, 1998, the full disclosure of which is incorporated herein by reference.

BACKGROUND OF THE INVENTION

1. Field of Invention

The present invention relates to a method of manufacturing a static random access memory (SRAM). More particularly, the present invention relates to a method of manufacturing a buried contact in the SRAM.

2. Description of Related Art

Since SRAM is one of the fastest operating semiconductor memory devices, it is widely used in computer equipment for the storage and retrieval of data. At present, SRAMs are extensively used in digital products including microcomputers and microprocessor systems.

Figure 1:
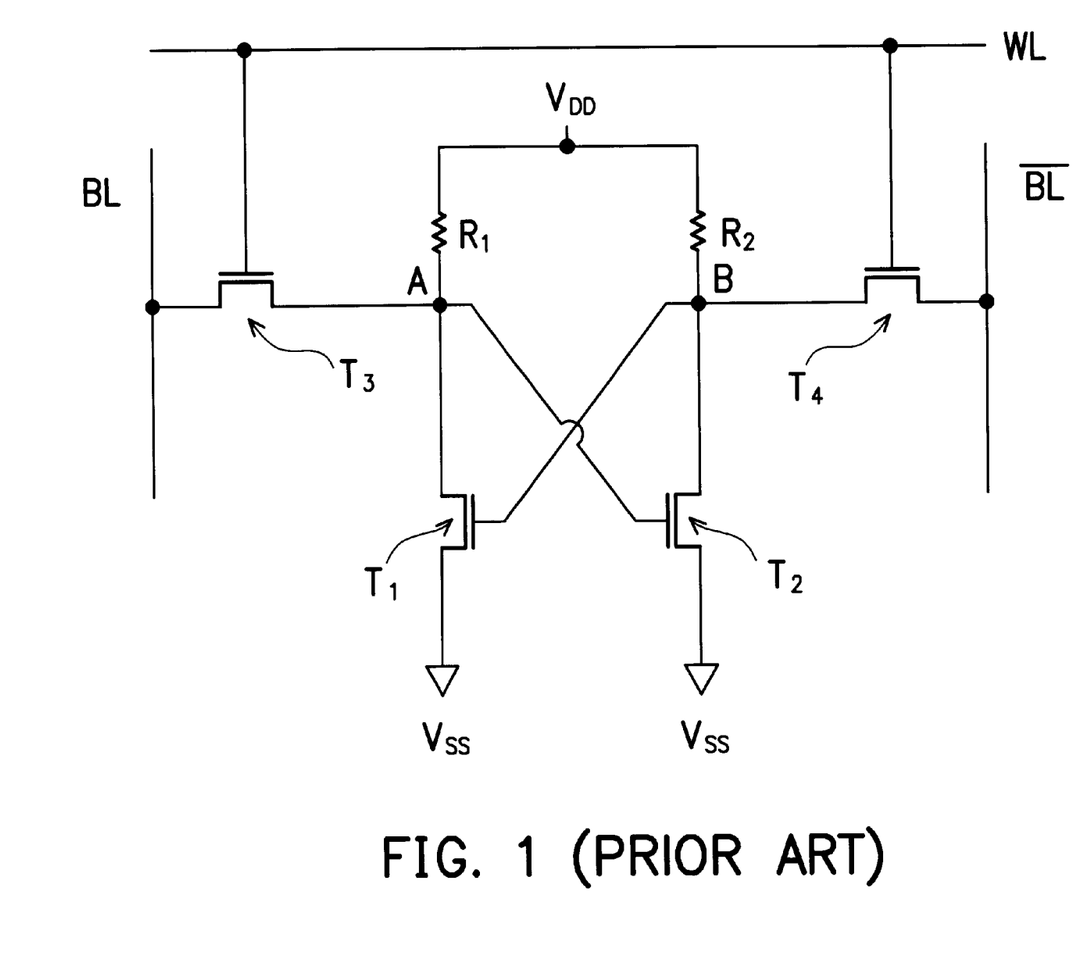
FIG. 1 is a diagram showing the circuit of a conventional SRAM cell.

In general, an SRAM can be divided into two structural regions, namely a memory cell region and peripheral circuit region. The memory cell is used for storing binary data, whereas, the peripheral circuit region has a number of address decoders, which are used to decode memory cell addresses issued from the memory cell region as well as to control related memory circuits. FIG. 1 is a diagram showing the circuit of a conventional SRAM cell.

As shown in FIG. 1, a conventional SRAM memory cell comprises of resistors (or reactance elements) $R_1$ and $R_2$, and MOS transistors $T_1$, $T_2$, $T_3$ and $T_4$. The resistor $R_1$ and the MOS transistor $T_1$ are connected in series, and the drain terminal and the source terminal of the MOS transistor $T_1$ are connected to a voltage source $V_{DD}$ and a ground line $V_{SS}$, respectively. Similarly, the resistor $R_2$ and the MOS transistor $T_2$ are connected in series, and the drain terminal and the source terminal of the MOS transistor $T_2$ are connected to the voltage source $V_{DD}$ and the ground line $V_{SS}$, respectively.

The gate terminal of the MOS transistor $T_2$, the drain terminal of the MOS transistor $T_1$ and the drain terminal of the MOS transistor $T_3$ are connected together at node point A. Similarly, at node point B, the gate terminal of the MOS transistor $T_1$, the drain terminal of the MOS transistor $T_2$ and the drain terminal of the MOS transistor $T_4$ are connected together. The gate terminals of MOS transistors $T_3$ and $T_4$ are both connected to a word line WL, whereas the source terminals of the MOS transistors $T_3$ and $T_4$ are connected to a bit line BL and a complementary bit line $\overline{BL}$, respectively. Functionally, the transistors $T_1$ and $T_2$ act as drivers, the transistors $T_3$ and $T_4$ act as storage and retrieval controllers for accessing the data stored inside the memory cell, and the resistors $R_1$ and $R_2$ serve as loads.

In the past, most SRAM contact window structures are formed above the source/drain region. However, due to the need for highly integrated circuits, conventional contact window structures have become inefficient. Consequently, a buried contact window structure suitable for fabricating local interconnects is invented. The buried contact structure is capable of reducing area occupation by up to 25%, for example, in SRAM. Hence, buried contact window structure is indispensable in the fabrication of high-density electronic products.

Conventionally, a buried contact window is formed by depositing a layer of polysilicon over the buried contact window region of a substrate. Then, the substrate is heated, allowing the dopants in the polysilicon layer to diffuse into the silicon substrate. The doped polysilicon layer remaining above the buried contact window region acts as a contact between the buried contact window region and a conductive line. However, should misalignment occur when the polysilicon layer is etched, a portion of the substrate inside the buried contact window region will be exposed. As the polysilicon layer is over-etched, a buried contact window trench will be formed. The presence of this buried contact window trench will interfere with transistor's current flow path, thereby leading to device malfunction.

To understand the situation better, the process of fabricating a conventional SRAM is described with reference to FIGS. 2A through 2G. FIGS. 2A through 2G are cross-sectional views showing the progression of manufacturing steps in fabricating the buried contact window of an SRAM cell according to the conventional method.

Figure 2A:
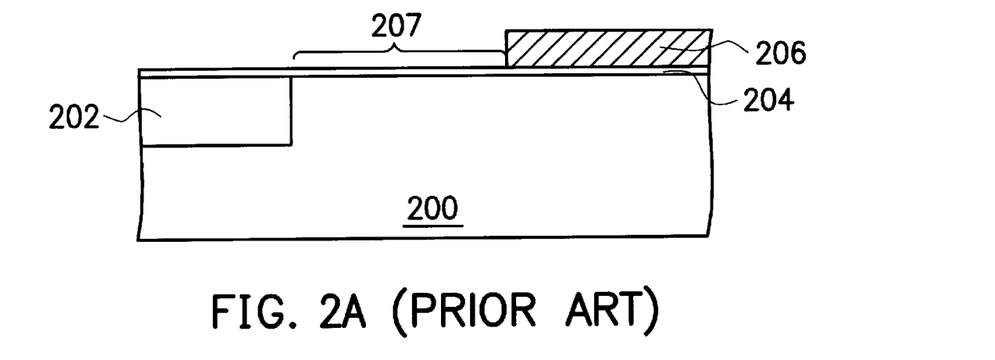
FIGS. 2A through 2G are cross-sectional views showing the progression of manufacturing steps in fabricating the buried contact window of an SRAM cell according to the conventional method.

First, as shown in FIG. 2A, a semiconductor substrate 200 is provided. The substrate 200 has a device isolating structure, for example, shallow trench isolation (STI) 202. Next, a gate oxide layer 204 is formed over the semiconductor substrate 200, and then a conductive layer 206, for example, a polysilicon layer, is formed over the gate oxide layer 204. Thereafter, the conductive layer 206 and the gate oxide layer 204 are patterned to expose the substrate region between the STI region 202 and the conductive layer 206/gate oxide layer 204. The exposed substrate region 207 between the STI region 202 and the conductive layer 206/gate oxide layer 204 is the region for forming the buried contact window.

Figure 2B:
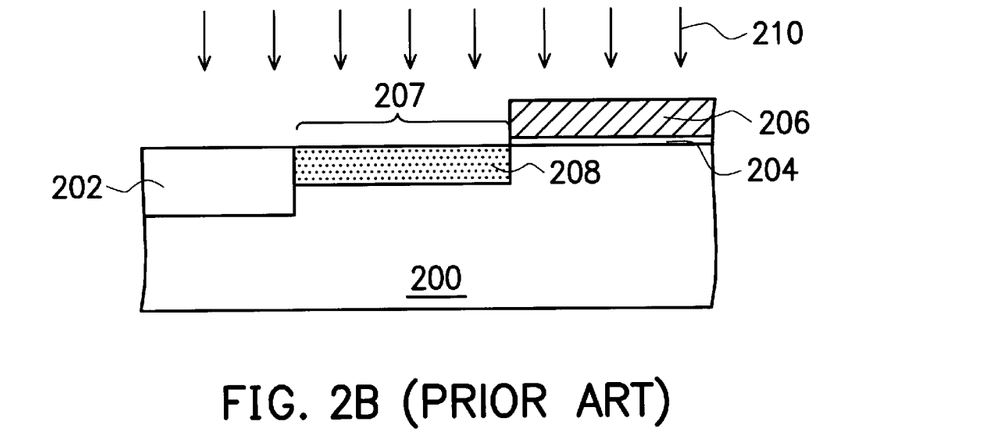

Next, as shown in FIG. 2B, an ion implantation is carried out, implanting ions into the desired contact window region in the semiconductor substrate 200 (the arrows as shown in FIG. 2B). Subsequently, conventional annealing is applied to form a heavily doped $N^+$ region 208.

Figure 2C:
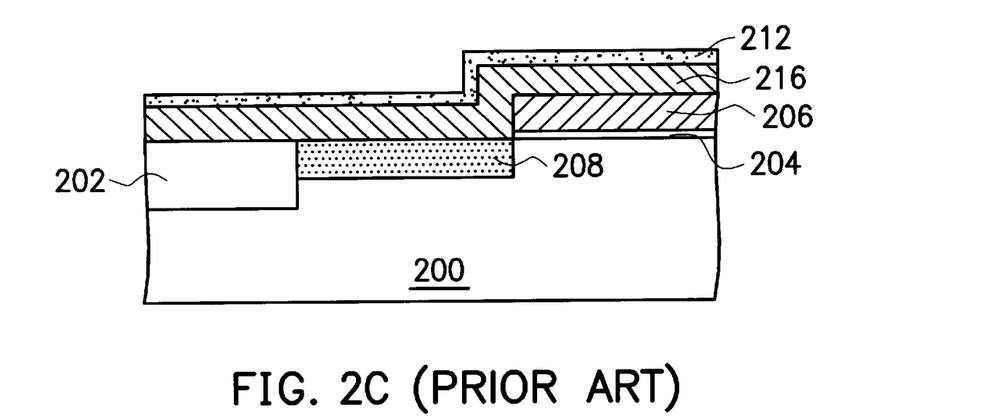

Next, as shown in FIG. 2C, conductive material, for example, polysilicon, is deposited over the semiconductor substrate 200 to form a conductive layer 216. Thereafter, a metal silicide layer 212 is formed over the conductive layer 216 to lower the resistance between the heavily doped $N^+$ region 208 in the buried contact window region and a conductive line. The metal silicide layer 212, for example, can be a tungsten silicide ($WSi_x$) layer formed preferably by a chemical vapor deposition (CVD), a sputtering or physical vapor deposition (PVD) method.

Figure 2D:
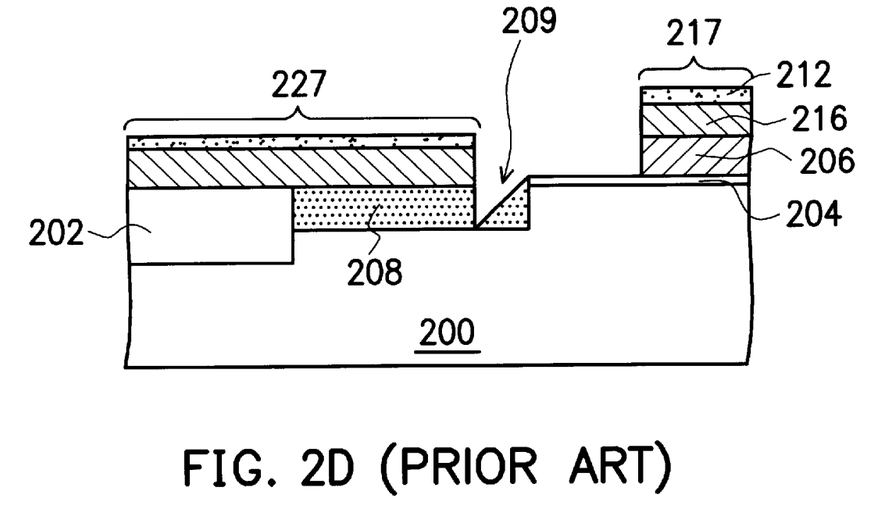

Next, as shown in FIG. 2D, a gate patterning operation is performed. In other words, a photoresist mask is formed over the metal silicide layer 212. Then, a multi-layered stack including the metal silicide layer 212, the conductive layer 216 and the conductive layer 206 are etched. Hence, a gate stack 217 and a conductive line 227 that connects electrically with the heavily doped $N^+$ region 208 are formed.

However, the heavily doped $N^+$ region 208, the conductive layer 216 and the conductive layer 206 are all made from the same material. Hence, in the aforementioned gate processing operation, should misalignment occur, a trench 209 will form in the heavily doped $N^+$ region of the buried contact window region. Moreover, the size of the trench 209 depends on the degree of over-etching. If the degree of over-etching is small, a shallow trench 209 is formed. A shallow trench in the heavily doped $N^+$ region will reduce the cross-sectional area of the heavily doped $N^+$ region 208 in the buried contact window region, thus leading to an increase in resistance. On the other hand, if the degree of over-etching is large, a deep trench 209 is formed. A deep trench in the heavily doped N⁺ region will cut off its connection with subsequently formed source/drain region making an open-circuit.

Figure 2E:
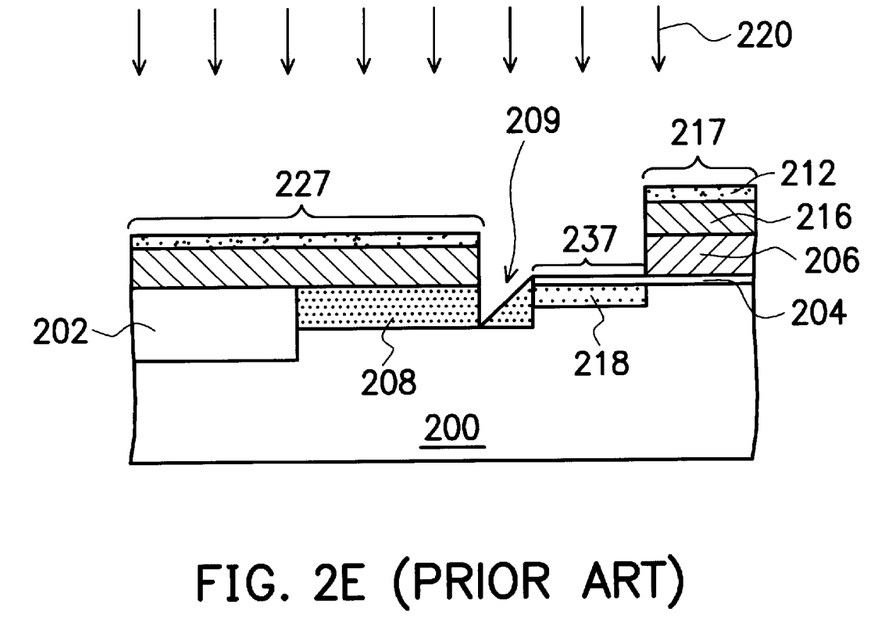

Next, as shown in FIG. 2E, another ion implantation is performed to form a source/drain region 237 in the substrate 200. In other words, using the gate stack 217 and the conductive layer 227 as masks, ions are implanted into the exposed semiconductor substrate 200 in region labeled 237 (arrows 220 in FIG. 2E). Then, the substrate 200 is annealed to form a lightly doped N⁻ region 218.

Figure 2F:
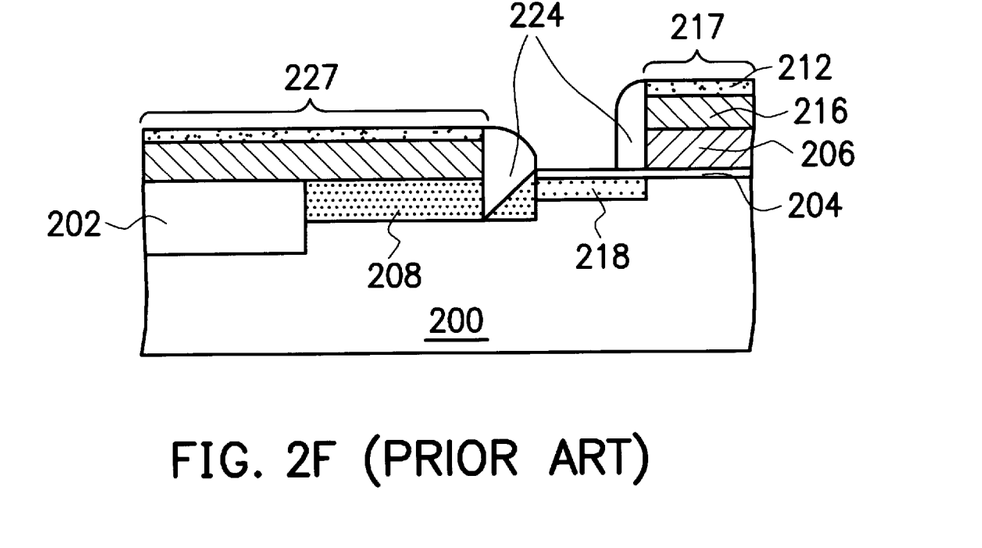

Next, as shown in FIG. 2F, an insulating layer is deposited over the semiconductor substrate 200, covering the gate stack 217, the conductive line 227 and lightly doped N⁻ region 218. Thereafter, an anisotropic etching of the insulating layer is carried out to form spacers 224 on the sidewalls of the gate stack 217 and the conductive line 227. The spacers 224 cover a portion of the lightly doped N⁻ region 218. Consequently, the spacer 224 can be used as a mask for forming the heavily doped region of a lightly doped drain (LDD) structure.

Figure 2G:
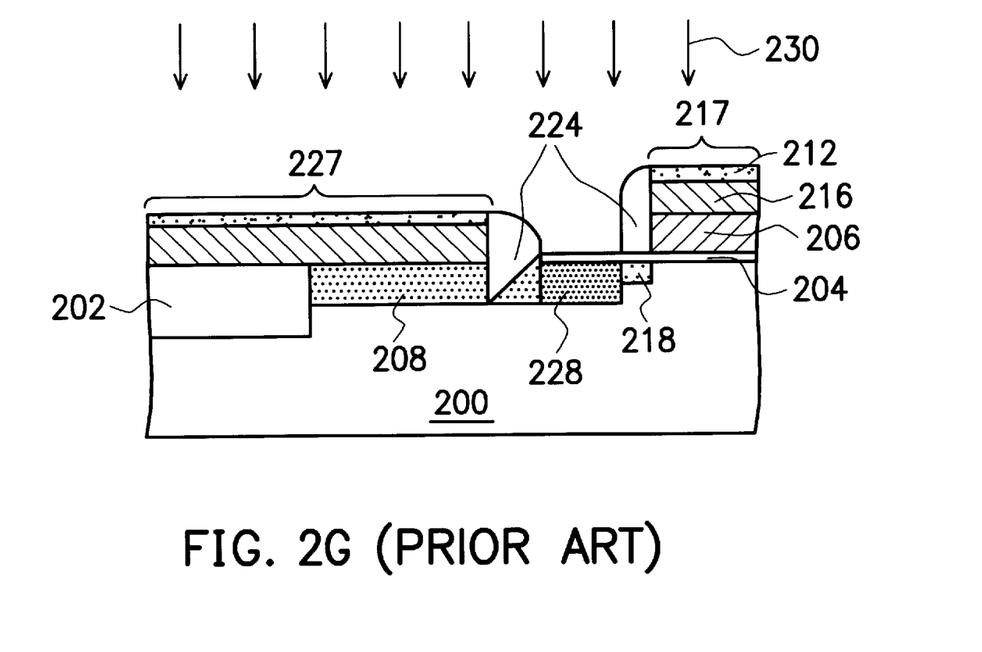

In the subsequent step, as shown in FIG. 2G, yet another ion implantation is carried out implanting ions into the source/drain region. In other words, ions having a high concentration are implanted into the lightly doped N⁻ region 218 (arrows labeled 218 in FIG. 2G). Thereafter, the substrate 200 is annealed to form a source/drain region having a lightly doped drain (LDD) structure, wherein the LDD structure includes the lightly doped N⁻ region 218 and the heavily doped N⁺ region 228. Since a portion of the substrate is covered by spacer 224, very few ions can have sufficient penetrating power to end up in that region. Therefore, regions having different dopant concentration are produced. Up to this stage, a complete buried contact window of an SRAM cell is fabricated.

In summary, the conventional method can easily lead to the over-etching of the heavily doped N⁺ region 208 in the buried contact window region when the gate stack 217 and the conductive line 227 are etched. Consequently, trench 209 is formed. Moreover, the size of the trench 209 depends on the degree of over-etching. If the degree of over-etching is small, a shallow trench 209 is formed. A shallow trench in the heavily doped N⁺ region will reduce the cross-sectional area of the heavily doped N⁺ region 208 in the buried contact window region, thus leading to an increase in resistance. On the other hand, if the degree of over-etching is large, a deep trench 209 is formed. A deep trench in the heavily doped N⁺ region will cut off its connection with subsequently formed source/drain region.

In light of the foregoing, there is a need to provide an improved method of forming buried contact window in SRAM cell.

SUMMARY OF THE INVENTION

Accordingly, the present invention is to provide a method of manufacturing the buried contact window of an SRAM cell capable of preventing any trench formation in the buried contact window due to misalignment, thereby lowering contact resistance between the buried contact window and the conductive line region.

To achieve these and other advantages and in accordance with the purpose of the invention, as embodied and broadly described herein, the invention provides a method of manufacturing the buried contact window of an SRAM cell. The method comprises the steps of first providing a substrate that has an isolating structure thereon, and then sequentially forming a gate oxide layer, a polysilicon layer and a sacrificial layer over the substrate. Next, the layers are patterned to expose a region on the substrate for forming the desired buried contact window. Thereafter, an ion implantation is performed so that the buried contact window region becomes a heavily doped region.

Subsequently, a self-aligned metal silicide processing operation is conducted to form a metal silicide layer above the substrate that covers at least the buried contact window region. After that, the unreacted metallic layer and the sacrificial layer are removed, and then a second polysilicon layer and a tungsten silicide layer are formed over the substrate. Next, the second polysilicon layer and the tungsten silicide layer are patterned to form a conductive line layer and a gate stack layer.

In addition, a portion of the substrate in the region between the conductive line layer and the gate stack layer is also exposed, defining a source/drain terminal area. The conductive line layer and the metal silicide layer are electrically connected together. Next, another ion implantation is conducted to form a lightly doped region in the source/drain terminal area underneath the substrate surface. Thereafter, spacers are formed on the sidewalls of the conductive line layer and the gate stack layer. Then, using the spacers as masks, a heavier ion implantation is carried out, forming a heavily doped region in the source/drain terminal area underneath the substrate surface. The heavily doped region and the lightly doped region together constitute a source/drain region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3I are cross-sectional views showing the progression of manufacturing steps in fabricating the buried contact window of an SRAM cell according to one preferred embodiment of this invention.

Figure 3A:
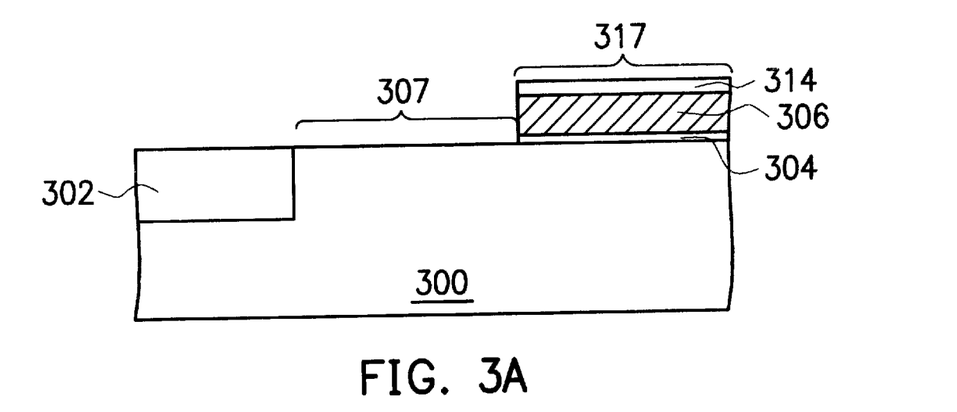
FIGS. 3A through 3I are cross-sectional views showing the progression of manufacturing steps in fabricating the buried contact window of an SRAM cell according to one preferred embodiment of this invention.

First, as shown in FIG. 3A, a semiconductor substrate 300 having an isolating structure, for example, shallow trench isolation (STI) 302, thereon is provided. Next, a gate oxide layer 304 having a thickness of between 40–350 Å is formed over the substrate 300 using, for example, a thermal oxidation method. Then, a conductive layer 306, for example, a polysilicon layer having a thickness of between 300–600 Å is formed over the gate oxide layer 304.

Thereafter, a sacrificial layer 314, for example, a silicon oxide layer having a thickness of between 100–300 Å is formed over the conductive layer 306. In the subsequent step, the sacrificial layer 314, the conductive layer 306 and the gate oxide layer 304 are patterned using, for example, a dry etching method. Consequently, a portion of the substrate between the shallow trench isolation region 302 and the stack formed by the remaining sacrificial layer 314, the conductive layer 306 and the gate oxide layer 304 is exposed. The exposed substrate becomes a region 307 for forming the desired buried contact window.

Figure 3B:
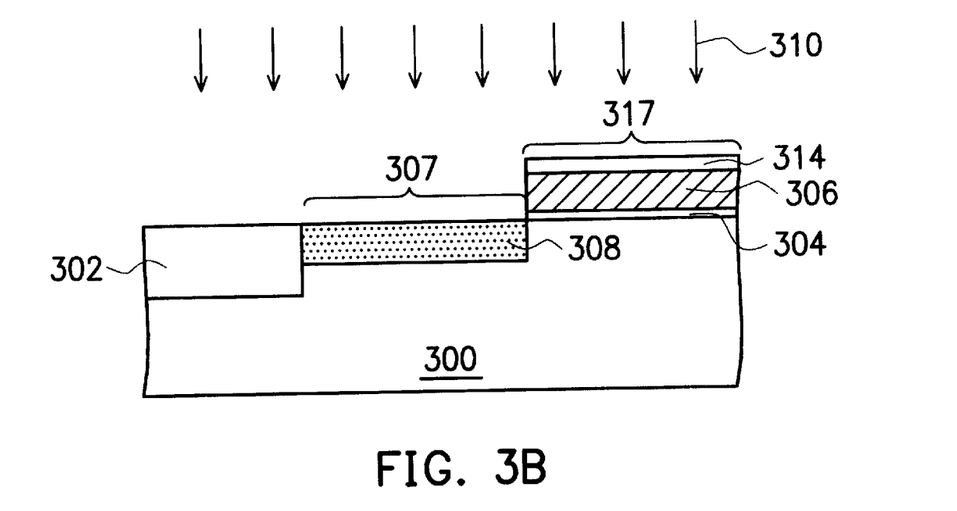

Next, as shown in FIG. 3B, a first ion implantation is conducted to implant ions into the buried contact window region 307 of the substrate 300 (arrows 310 in FIG. 3B). For example, phosphorus ($P^{31}$) is used as the doping ions in the first implantation. The implantation is carried out using an energy level of between 10–100 KeV and a dosage of between $1.0 \times 10^{14}$–$5.0 \times 10^{15}$ atoms/cm$^2$. Subsequently, an annealing operation is carried out to form a heavily doped $N^+$ region 308.

Figure 3C:
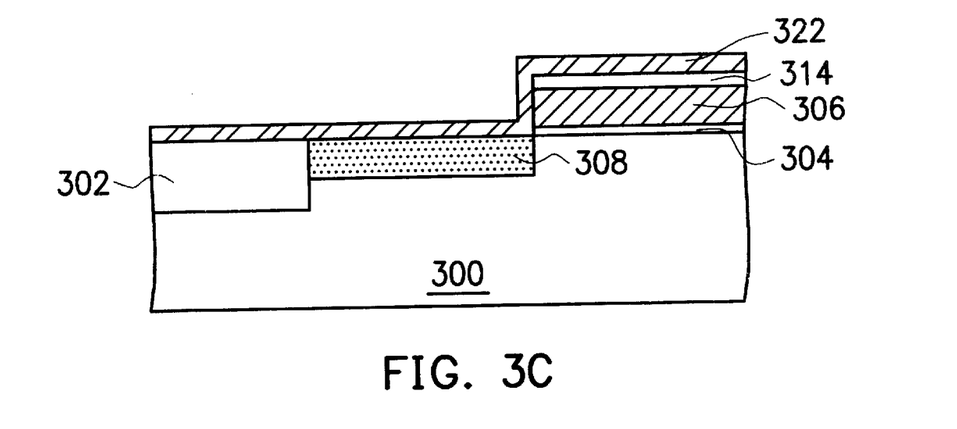

Next, as shown in FIG. 3C, a self-aligned metal silicide (Salicide) process is carried out by forming a blanket metallic layer 322 over the entire substrate 300. The metallic layer preferably having a thickness of between 300–1000 Å can be, for example, a titanium, platinum or cobalt layer deposited over the substrate 300 using a physical vapor deposition method or a chemical vapor deposition method.

Figure 3D:
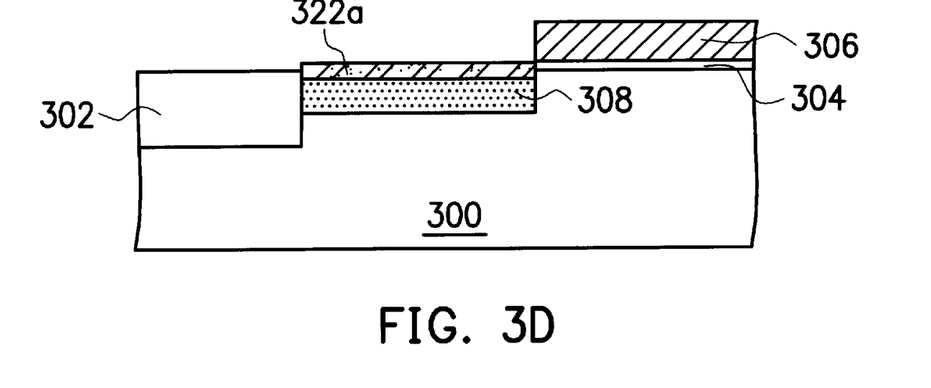

Next, as shown in FIG. 3D, a thermal processing treatment is performed by rapidly heating the wafer to a temperature of about 700° C. using a rapid thermal process (RTP). Consequently, the metallic layer 322 reacts with the silicon in the heavily doped $N^+$ region 308 to form a metal silicide layer 322a. For example, if titanium is deposited over the substrate 300, a titanium silicide (TiSi$_x$) is ultimately formed. Since no reaction will occur in a region where the metal has no contact with the silicon substrate 300, a portion of the metallic layer 322 will remain. Therefore, a wet etching method is used to remove the unreacted metallic layer 322 (for example, titanium layer) and the sacrificial layer 314 formerly serving as a protective layer for the conductive layer 306.

Figure 3E:
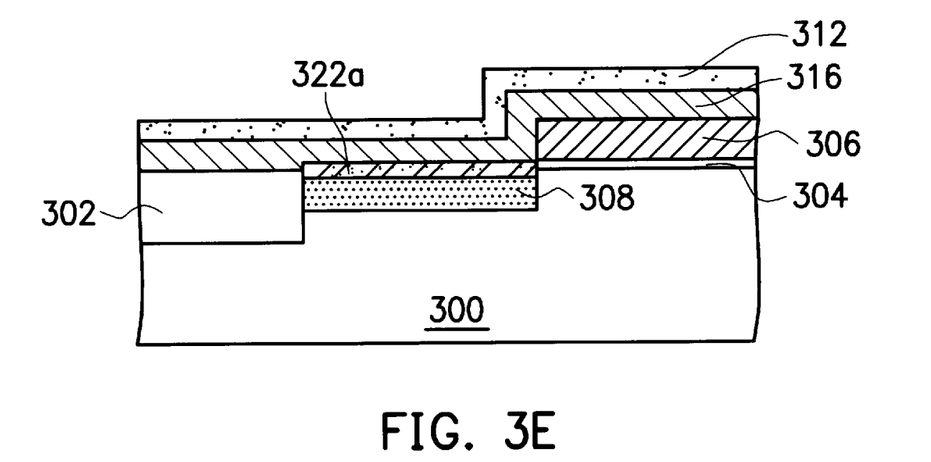

Next, as shown in FIG. 3E, a conductive layer 316 is formed over the semiconductor substrate 300 using, for example, a low-pressure chemical vapor deposition (LPCVD). The conductive layer 316 can be a polysilicon layer preferably having a thickness of between 1000–4000 Å. Thereafter, a metal silicide layer 312 is formed over the conductive layer 316 to lower the resistance between the heavily doped $N^+$ region in the buried contact window and conductive line. Preferably, the metal silicide layer 312 is a tungsten silicide (WSi$_x$) layer having a thickness of about 1500 Å formed by a chemical vapor deposition (CVD), a sputtering, or a physical vapor deposition method.

Figure 3F:
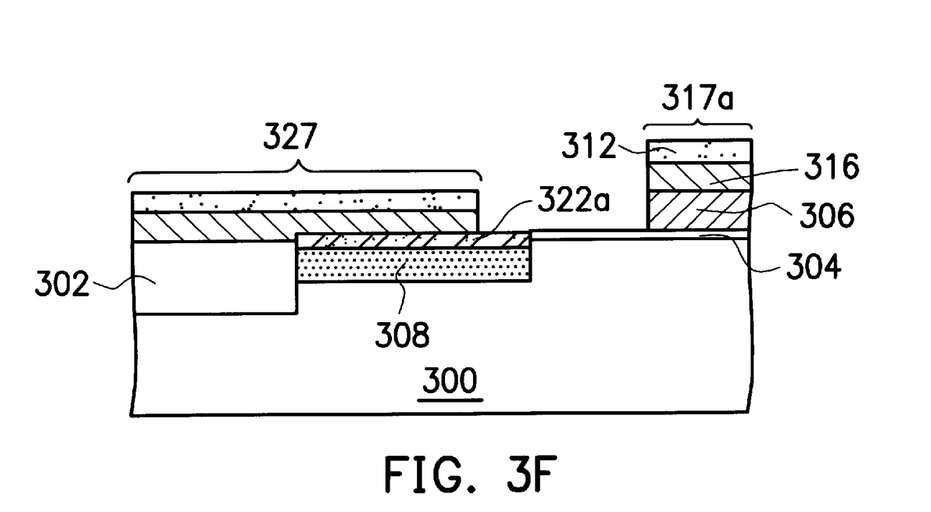

Next, as shown in FIG. 3F, a gate patterning operation is carried out. In other words, a photoresist mask (not shown in the figure) is deposited over the metal silicide layer 312. Then, a multi-layered stack including the metal silicide layer 312, the conductive layer 316 and the conductive layer 306 are formed by etching using, for example, a reactive ion etching (RIE) method. Consequently, a gate stack 317a and a conductive layer 327 having electrical connection with the metal silicide layer 322a above the heavily doped $N^+$ region 308 are formed.

In this invention, although the $N^+$ heavily doped region 308 and the conductive layers 316, 306 are made from the same material (silicon), a metal silicide layer 322a is specifically formed over the heavily doped $N^+$ region 308 of the buried contact window. Besides lowering the contact resistance between the conductive region and the heavily doped $N^+$ region, the metal silicide layer 322a can serve as a mask when the gate stack layer 317a and the conductive line layer 327 is patterned.

Hence, over-etching of the heavily doped $N^+$ region 308 to form a trench due to misalignment can be avoided. A trench in the heavily doped $N^+$ region 308 can lead to a reduction of its cross-sectional area and can result in a higher resistance. In the worst case, the trench may create an open-circuit condition between the heavily doped $N^+$ region 308 and subsequently formed source/drain region.

Figure 3G:
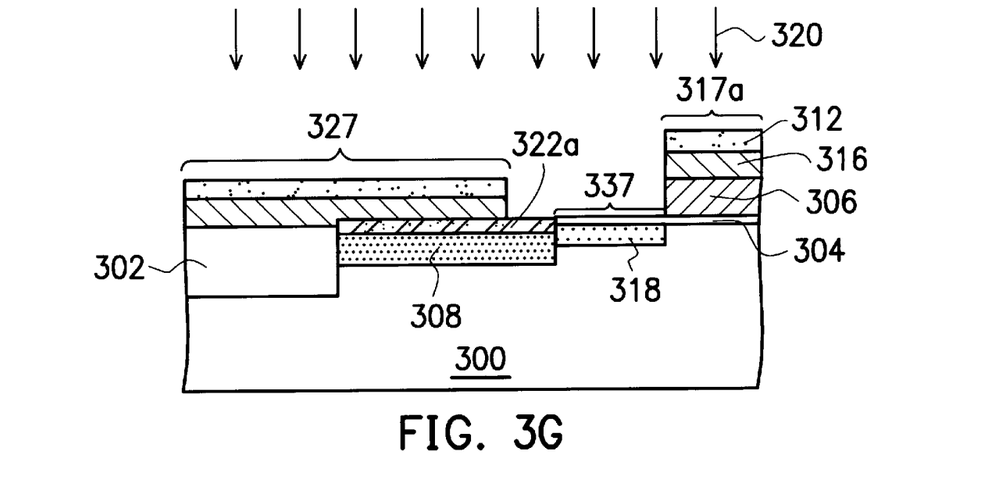

Next, as shown in FIG. 3G, a second ion implantation is carried out. In other words, using the gate stack layer 317a and the conductive line layer 327 as masks, ions are implanted into the exposed semiconductor substrate region 337 where the source/drain region is desired (arrows 320 in FIG. 3G). For example, phosphorus ($P^{31}$) is used as the doping ions in the second implantation. The implantation is carried out using an energy level of between 10–100 KeV and a dosage of between $1.0 \times 10^{13}$–$5.0 \times 10^{14}$ atoms/cm$^2$. Subsequently, an annealing operation is carried out to form a lightly doped $N^-$ region 318.

Figure 3H:
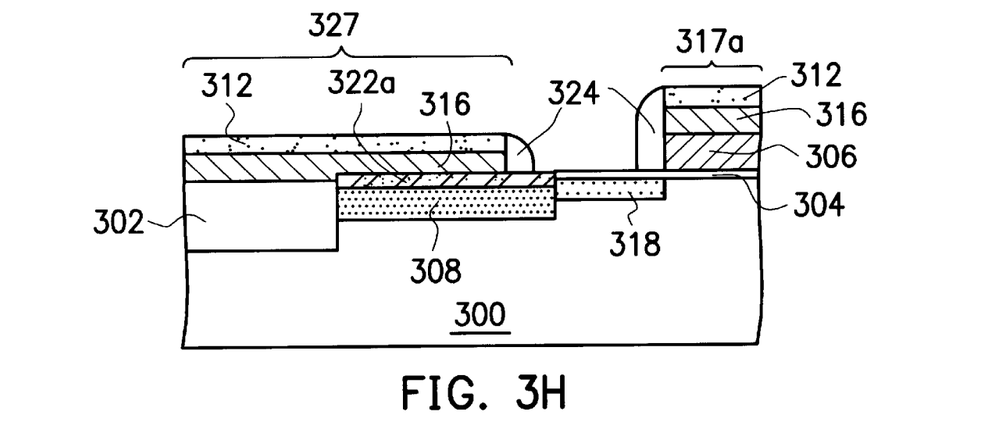

Next, as shown in FIG. 3H, a blanket insulation layer, for example, a tetra-ethyl-ortho-silicate (TEOS) layer having a thickness of between 4000–6000 Å is deposited over semiconductor substrate 300 using, for example, a chemical vapor deposition method. The blanket insulation layer covers the gate stack layer 317a, the conductive line layer 327, a portion of the heavily doped $N^+$ region 308 and the lightly doped $N^-$ region 318. Thereafter, the insulation layer is anisotropically etched to form spacers 324 on the sidewall of the gate stack layer 317a and the conductive line layer 327. The spacer 324 covers at least a portion of the lightly doped $N^-$ region 318, and serves as a mask for forming the heavily doped region of a lightly doped drain (LDD) structure.

Figure 3I:
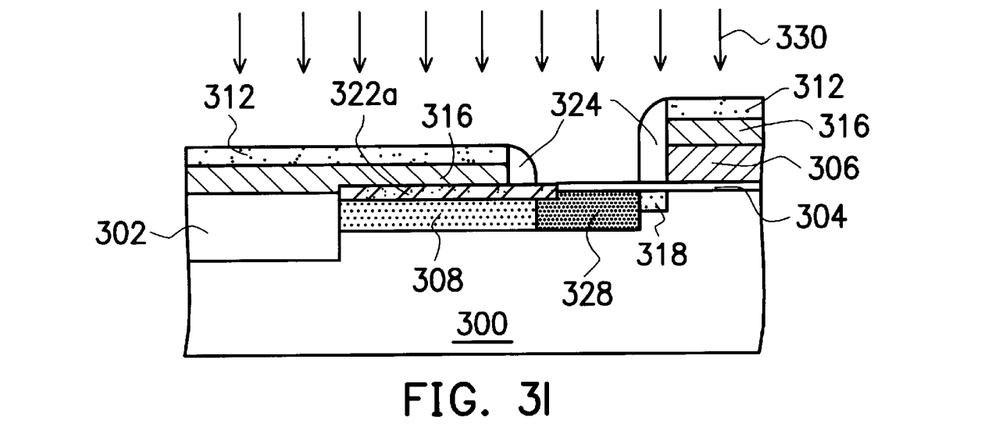

Next, as shown in FIG. 3I, a third ion implantation is carried out implanting ions into the substrate 300 to form the source/drain region. In other words, a highly concentrated beam of ions is used to implant ions into the lightly doped $N^-$ region 318 (arrows 330 in FIG. 3I). Then, the substrate 300 is annealed to form a lightly doped drain (LDD) structure in the source/drain region. Since a portion of the substrate is covered by spacer 324, very few ions have sufficient penetrating power to end up in that region. Therefore, regions having different dopant concentrations are produced. Preferably, the third implantation is conducted using arsenic ($As^{75}$) as the doping ions.

The implantation is carried out using an energy level of between 5000 KeV and a dosage of between $1.0 \times 10^{144}$–$5.0 \times 10^{15}$ atoms/cm$^2$. Up to this stage, a complete buried contact window of an SRAM cell is fabricated. Finally, subsequent processes for forming the SRAM are carried out. Since these operations are not directly related to this invention, detailed description is omitted here.

In summary, special aspects of this invention includes:

1. The metal silicide layer formed over the heavily doped $N^+$ region of a buried contact window can serve as a protective mask when the gate stack and the conductive line layer are formed by etching. Hence, the formation of a trench in the heavily doped N$^+$ region due to misalignment and over-etching is avoided. A trench in the heavily doped N$^+$ region can lead to a reduction of its cross-sectional area and can result in a higher resistance. In some serious cases, the trench may be so deep as to create an open-circuit condition between the heavily doped N$^+$ region and subsequently formed source/drain region.

2. By coating a metal silicide layer over the heavily doped N$^+$ region of the buried contact window, contact resistance between the conductive line region and the heavily doped N$^+$ region is lowered.

3. Methods used in this invention are compatible with current manufacturing processes. Hence, the invention can be readily incorporated into an existing production facility.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing the buried contact window of a static random access memory (SRAM) cell, the method comprising the steps of:

providing a first conductive conductive-type substrate having a device isolation structure thereon;

forming an oxide layer, a first conductive layer and a sacrificial layer over the substrate;

patterning the oxide layer, the first conductive layer and the sacrificial layer to expose a first region in the substrate for forming the desired buried contact window;

performing a first ion implantation forming a first heavily doped region of a second conductive type in the substrate underneath the first region;

forming a metallic layer over the substrate that covers at least the first region;

performing a heat treatment so that the metallic layer above the first region reacts to form a metal silicide layer;

removing the unreacted metallic layer and the sacrificial layer;

forming a second conductive layer and a third conductive layer over the substrate; and patterning the second conductive layer and the third conductive layer to form a conductive line layer and a gate stack exposing a second region between the conductive line layer and the gate stack for forming a source/drain region, wherein the conductive line layer and the metal silicide layer are electrically coupled.

2. The method of claim 1, wherein the step of forming the first conductive layer includes depositing polysilicon.

3. The method of claim 1, wherein the step of forming the sacrificial layer includes depositing silicon oxide.

4. The method of claim 1, wherein the step of patterning the oxide layer, the first conductive layer and the sacrificial layer includes a dry etching method.

5. The method of claim 1, wherein the step of performing the first ion implantation includes using phosphorus (P$^{31}$) as the doping ions, carrying out the implantation using an energy level of between 10–100 KeV and a dosage of between $1.0 \times 10^{14}$–$5.0 \times 10^{15}$ atoms/cm$^2$, and subsequently annealing.

6. The method of claim 1, wherein the step of forming the metallic layer includes depositing one of a group of metals that includes titanium, platinum and cobalt.

7. The method of claim 1, wherein the step of forming the metal silicide layer includes carrying out a reaction to form a titanium silicide layer.

8. The method of claim 1, wherein the step of removing the unreacted metal and the sacrificial layer includes a wet etching method.

9. The method of claim 1, wherein the step of forming the second conductive layer includes depositing polysilicon.

10. The method of claim 1, wherein the step of forming the third conductive layer includes carrying out a reaction to form a tungsten silicide layer.

11. The method of claim 1, wherein the step of patterning the second conductive layer and the third conductive layer includes a reactive ion etching method.

12. The method of claim 1, wherein after the step of patterning the second and the third conductive layers, further includes the steps of:

performing a second ion implantation implanting ions into the substrate underneath the second region to form a lightly doped region of the second conductive type;

forming spacers on the sidewalls of the conductive line layer and the gate stack layer; and performing a third ion implantation using the spacers as masks to form a second heavily doped region of the second conductive type in the substrate underneath the second region, wherein the lightly doped region and the second heavily doped region constitute a source/drain region.

13. The method of claim 12, wherein the step of performing the second ion implantation includes using phosphorus (P$^{31}$) as the doping ions, carrying out the implantation using an energy level of between 10–100 KeV and a dosage of between $1.0 \times 10^{13}$–$5.0 \times 10^{14}$ atoms/cm$^2$, and then, annealing.

14. The method of claim 12, wherein the step of forming the spacers includes depositing tetra-ethyl-ortho-silicate (TEOS) glass.

15. The method of claim 12, wherein the step of performing the third ion implantation includes using arsenic (As$^{75}$) as the doping ions, carrying out the implantation using an energy level of between 50 100 KeV and a dosage of between $1.0 \times 10^{14}$–$5.0 \times 10^{15}$ atoms/cm$^2$, and then annealing.

16. A method of manufacturing the buried contact window of a static random access memory (SRAM) cell, the method comprising the steps of:

providing a first conductive type substrate having a device isolation structure and a stack structure thereon, wherein the stack structure includes an oxide layer, a first conductive layer and a sacrificial layer;

forming a first heavily doped region of a second conductive type in the substrate between the device isolating structure and the stack structure;

forming a metal silicide layer over the first heavily doped region, wherein the metal silicide layer and the first heavily doped region are electrically coupled;

removing the sacrificial layer;

forming a second conductive layer over the substrate; and patterning the second conductive layer to form a conductive line layer and a gate stack, and then forming a source/drain region that has a lightly doped drain structure, wherein the conductive line layer and the metal silicide layer are electrically coupled.

17. The method of claim 16, wherein the step of forming the first conductive layer includes depositing polysilicon.

18. The method of claim 16, wherein the step of forming the first heavily doped region includes implanting ions into the substrate between the device isolating structure and the stack structure.

19. The method of claim 18, wherein the step of implanting ions into the substrate includes using phosphorus ($P^{31}$) as the doping ions, carrying out the implantation using an energy level of between 10–100 KeV and a dosage of between $1.0 \times 10^{14}$–$5.0 \times 10^{15}$ atoms/cm$^2$, and then annealing.

20. The method of claim 16, wherein the step of forming the metal silicide layer further includes the substeps of:

forming a metallic layer over the substrate at least covering the first heavily doped region;

performing a thermal treatment so that the silicon in the first heavily doped region reacts with the metal to form a metal silicide layer; and removing the unreacted metallic layer.

21. The method of claim 20, wherein the step of forming the metallic layer includes depositing one of a group of metals that includes titanium, platinum and cobalt.

22. The method of claim 16, wherein the step of forming the metal silicide layer includes depositing titanium to form a titanium silicide layer.

23. The method of claim 16, wherein the step of removing the sacrificial layer includes a wet etching method.

24. The method of claim 16, wherein the step of forming the second conductive layer includes depositing to form a polysilicon layer and a tungsten silicide layer.

25. The method of claim 16, wherein the step of patterning the second conductive layer includes a reactive ion etching method.

26. The method of claim 16, wherein the step of forming the source/drain region having a lightly doped drain structure includes:

performing a first ion implantation implanting ions into the substrate between the conductive line layer and the gate stack to form a lightly doped region of the second conductive type;

forming spacers on the sidewalls of the conductive line layer and the gate stack; and performing a second ion implantation using the spacers as masks to form a second heavily doped region of the second conductive type in the lightly doped region not being covered by spacers, wherein the lightly doped region and the second heavily doped region together constitute a source/drain region that has a lightly doped drain structure.

27. The method of claim 26, wherein the step of performing the first ion implantation includes using phosphorus ($P^{31}$) as the doping ions, carrying out the implantation using an energy level of between 10–100 KeV and a dosage of between $1.0 \times 10^{13}$–$5.0 \times 10^{14}$ atoms/cm$^2$, and then annealing.

28. The method of claim 26, wherein the step of forming the spacers includes depositing tetra-ethyl-ortho-silicate (TEOS) glass.

29. The method of claim 26, wherein the step of performing the second ion implantation includes using arsenic ($As^{75}$) as the doping ions and carrying out the implantation using an energy level of between 50–100 KeV and a dosage of between $1.0 \times 10^{14}$–$5.0 \times 10^{15}$ atoms/cm$^2$, and then followed by an annealing operation.

30. A method of manufacturing the buried contact window of a static random access memory (SRAM) cell, the method comprising the steps of:

providing a first conductive type substrate having a device isolation structure and a stack structure thereon, wherein the stack structure includes an oxide layer, a first conductive layer and a sacrificial layer;

forming a first heavily doped region of a second conductive type in the substrate between the device isolating structure and the stack structure;

forming a metal silicide layer over the first heavily doped region and the stack structure;

forming a second conductive layer over the substrate covering at least the metal silicide layer; and patterning the second conductive layer to form a conductive line layer and a gate stack exposing a second region between the conductive line layer and the gate stack for forming a source/drain region, wherein the conductive line layer and the metal silicide layer are electrically coupled.

31. The method of claim 30, wherein the step of forming the first conductive layer includes depositing polysilicon.

32. The method of claim 30, wherein the step of forming the first heavily doped region includes implanting ions into the substrate between the device isolating structure and the stack structure.

33. The method of claim 32, wherein the step of implanting ions into the substrate includes using phosphorus ($P^{31}$) as the doping ions, carrying out the implantation using an energy level of between 10–100 KeV and a dosage of between $1.0 \times 10^{14}$–$5.0 \times 10^{15}$ atoms/cm$^2$, and then, annealing.

34. The method of claim 30, wherein the step of forming the metal silicide layer further includes the substeps of:

forming a metallic layer over the substrate at least covering the first heavily doped region and the stack structure;

performing a thermal treatment so that the silicon in the first heavily doped region and the stack structure react with the metal to form a metal silicide layer; and removing the unreacted metallic layer.

35. The method of claim 34, wherein the step of forming the metallic layer includes depositing one of a group of metals that includes titanium, platinum and cobalt.

36. The method of claim 30, wherein the step of forming the metal silicide layer includes depositing titanium to form a titanium silicide layer.

37. The method of claim 30, wherein the step of forming the second conductive layer includes depositing to form a polysilicon layer and a tungsten silicide layer.

38. The method of claim 30, wherein the step of patterning the second conductive layer includes a reactive ion etching method.

* * * * *